(12) United States Patent
Komatsu et al.

(10) Patent No.: US 10,979,028 B2
(45) Date of Patent: Apr. 13, 2021

(54) REDUCED TEMPERATURE COEFFICIENT OF FREQUENCY AT FILTER TRANSITION BAND WHILE RETAINING PASS-BAND WIDTH

(71) Applicant: SKYWORKS SOLUTIONS, INC., Irvine, CA (US)

(72) Inventors: Tomoya Komatsu, Irvine, CA (US); Joji Fujiwara, Suita (JP)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 0 days.

(21) Appl. No.: 16/392,826

(22) Filed: Apr. 24, 2019

(65) Prior Publication Data

US 2019/0341911 A1   Nov. 7, 2019

Related U.S. Application Data

(60) Provisional application No. 62/667,236, filed on May 4, 2018.

(51) Int. Cl.
*H03H 9/64* (2006.01)
*H03H 9/72* (2006.01)

(52) U.S. Cl.
CPC ........ *H03H 9/6483* (2013.01); *H03H 9/6476* (2013.01); *H03H 9/725* (2013.01)

(58) Field of Classification Search
CPC ................................................. H03H 9/54–76
See application file for complete search history.

(56) References Cited

U.S. PATENT DOCUMENTS

| 7,385,464 | B2* | 6/2008 | Shibagaki | H03H 9/605 333/133 |
| 7,408,428 | B2* | 8/2008 | Larson, III | H03H 9/175 333/187 |
| 8,026,776 | B2* | 9/2011 | Ueda | H03H 9/6483 333/133 |
| 8,125,298 | B2* | 2/2012 | Hara | H03H 9/725 333/133 |
| 8,294,330 | B1 | 10/2012 | Abbott et al. | |
| 9,124,243 | B2* | 9/2015 | Tamasaki | H03H 9/02559 |

(Continued)

OTHER PUBLICATIONS

Shin et al., "Balanced RF Duplexer with Low Interference Using Hybrid BAW Resonators for LTE Application", ETRI Journal, vol. 36, No. 2, Apr. 2014, pp. 317-320.

*Primary Examiner* — Dean O Takaoka
*Assistant Examiner* — Alan Wong
(74) *Attorney, Agent, or Firm* — Lando & Anastasi, LLP

(57) ABSTRACT

An electronic filter includes a plurality of series arm acoustic wave resonators electrically connected in series between an input port and an output port, a plurality of parallel arm acoustic wave resonators electrically connected in parallel and electrically connected on first sides between respective ones of the plurality of series arm acoustic wave resonators and electrically connected on second sides to ground, and at least one additional acoustic wave resonator electrically connected in parallel to one of one of the plurality of series arm acoustic wave resonators or one of the plurality of parallel arm acoustic wave resonators and having a temperature coefficient of frequency (TCF) lower than a TCF of the acoustic wave resonator to which it is electrically connected in parallel.

25 Claims, 13 Drawing Sheets

(56) References Cited

U.S. PATENT DOCUMENTS

| | | |
|---|---|---|
| 9,154,110 B2 | 10/2015 | Kim et al. |
| 9,467,117 B2 * | 10/2016 | Fujiwara .............. H03H 9/6483 |
| 10,608,612 B2 * | 3/2020 | Kauschke ............ H03H 9/6483 |

* cited by examiner

REDUCED TEMPERATURE COEFFICIENT OF FREQUENCY AT FILTER TRANSITION BAND WHILE RETAINING PASS-BAND WIDTH

CROSS-REFERENCE TO RELATED APPLICATIONS

This application claims priority under 35 U.S.C. § 119(e) to U.S. Provisional Patent Application Ser. No. 62/667,236, titled "TEMPERATURE COEFFICIENT OF FREQUENCY AT FILTER TRANSITION BAND WHILE RETAINING PASS-BAND WIDTH," filed May 4, 2018, which is incorporated by reference herein in its entirety for all purposes.

BACKGROUND

In the field of information communication devices, for example, mobile phones, the bandgap between transmission and reception frequency bands in new communication standards are becoming narrower while the desire to utilize all available assigned bandwidth is increasing. The bandgap between frequency bands used in different standards is also becoming more narrow. For example, in the Long Term Evolution (LTE) band 7 (a.k.a. IMT-E), the transmission channel occupies frequencies between 2,500 MHz to 2,570 MHZ, and the reception channel occupies frequencies between 2,620 MHz and 2,690 MHz. There is only a 0.7% fractional bandgap between the frequency bands utilized by LTE band 7 and the WiFi band (2,400 MHz to 2,483 MHz). To avoid interference between signals from devices operating on such narrowly spaced frequency bands, it is becoming increasingly important for RF filters utilized in such devices to define frequency bands with well-defined sharp boundaries that do not move significantly under different operating conditions, for example, at different temperatures.

SUMMARY

In accordance with an aspect disclosed herein, there is provided an electronic filter. The electronic filter comprises a plurality of series arm acoustic wave resonators electrically connected in series between an input port and an output port, a plurality of parallel arm acoustic wave resonators electrically connected in parallel and electrically connected on first sides between respective ones of the plurality of series arm acoustic wave resonators and electrically connected on second sides to ground, and at least one additional acoustic wave resonator electrically connected in parallel to one of one of the plurality of series arm acoustic wave resonators or one of the plurality of parallel arm acoustic wave resonators and having a temperature coefficient of frequency (TCF) lower than a TCF of the acoustic wave resonator to which it is electrically connected in parallel.

In some embodiments, the at least one additional acoustic wave resonator is electrically connected in parallel to one of the plurality of series arm acoustic wave resonators and has a resonant frequency above an upper edge of a passband of the filter.

In some embodiments, the at least one additional acoustic wave resonator is electrically connected in parallel to one of the plurality of parallel arm acoustic wave resonators and has a resonant frequency lower than a lower edge of a passband of the filter.

In some embodiments, the plurality of series arm acoustic wave resonators, the plurality of parallel arm acoustic wave resonators, and the at least one additional acoustic wave resonator are bulk acoustic wave (BAW) resonators.

In some embodiments, the plurality of series arm acoustic wave resonators, the plurality of parallel arm acoustic wave resonators, and the at least one additional acoustic wave resonator are surface acoustic wave (SAW) resonators having interdigital transducer (IDT) electrodes disposed on a piezoelectric substrate. The IDT electrodes of the plurality of series arm acoustic wave resonators, the plurality of parallel arm acoustic wave resonators, and the at least one additional acoustic wave resonator may be covered by silicon dioxide ($SiO_2$), the IDT electrodes of the at least one additional acoustic wave resonator being covered by a thicker layer of $SiO_2$ than the IDT electrodes of the plurality of series arm acoustic wave resonators and the IDT electrodes of the plurality of parallel arm acoustic wave resonators. The at least one additional acoustic wave resonator may include a first additional acoustic wave resonator electrically connected in parallel to a first one of the plurality of series arm acoustic wave resonators and a second additional acoustic wave resonator electrically connected in parallel to a second one of the plurality of series arm acoustic wave resonators. Each of the first additional acoustic wave resonator and the second additional acoustic wave resonator may have a TCF lower than the first one of the plurality of series arm acoustic wave resonators and the second one of the plurality of series arm acoustic wave resonators. Only one of the first additional acoustic wave resonator and the second additional acoustic wave resonator may have a TCF lower than the first one of the plurality of series arm acoustic wave resonators and the second one of the plurality of series arm acoustic wave resonators.

In some embodiments, the at least one additional acoustic wave resonator includes a first additional acoustic wave resonator electrically connected in parallel to a first one of the plurality of parallel arm acoustic wave resonators and a second additional acoustic wave resonator electrically connected in parallel a second one of the plurality of parallel arm acoustic wave resonators. Each of the first additional acoustic wave resonator and the second additional acoustic wave resonator may have a TCF lower than the first one of the plurality of parallel arm acoustic wave resonators and the second one of the plurality of parallel arm acoustic wave resonators. Only one of the first additional acoustic wave resonator and the second additional acoustic wave resonator may have a TCF lower than the first one of the plurality of parallel arm acoustic wave resonators and the second one of the plurality of parallel arm acoustic wave resonators.

In some embodiments, the at least one additional acoustic wave resonator is electrically connected in parallel to one of the plurality of series arm acoustic wave resonators and the IDT electrodes of at least one of the plurality of series arm acoustic wave resonators are covered by a covered by a thinner layer of $SiO_2$ than the IDT electrodes of the plurality of parallel arm acoustic wave resonators.

In some embodiments, the at least one additional acoustic wave resonator is electrically connected in parallel to one of the plurality of parallel arm acoustic wave resonators and the IDT electrodes of at least one of the plurality of parallel arm acoustic wave resonators are covered by a covered by a thinner layer of $SiO_2$ than the IDT electrodes of the plurality of series arm acoustic wave resonators.

In some embodiments, the filter further comprises a layer of a silicon nitride covering the $SiO_2$ over each of the IDT electrodes of the plurality of series arm acoustic wave resonators, the IDT electrodes of the plurality of parallel arm acoustic wave resonators, and the IDT electrodes of the at least one additional acoustic wave resonator In some embodiments, the IDT electrodes of the plurality of series arm acoustic wave resonators and the IDT electrodes of the plurality of parallel arm acoustic wave resonators have a greater pitch than the IDT electrodes of the at least one additional acoustic wave resonator.

In some embodiments, the filter is a radio frequency filter. The filter may be included in a fifth-generation radio frequency circuit. The filter may be included in an electronic device module. The filter may be included in a transmit and receive module. The electronic device module may be a radio frequency device module. The filter may be included in an electronic device.

In accordance with another aspect, there is provided a method of forming an electronic filter. The method comprises forming a plurality of series arm acoustic wave resonators electrically connected in series between an input port and an output port, forming a plurality of parallel arm acoustic wave resonators electrically connected in parallel and electrically connected on first sides between respective ones of the plurality of series arm acoustic wave resonators and electrically connected on second sides to ground, and forming at least one additional acoustic wave resonator electrically connected in parallel to one of one of the plurality of series arm acoustic wave resonators or one of the plurality of parallel arm acoustic wave resonators and having a temperature coefficient of frequency (TCF) lower than a TCF of the acoustic wave resonator to which it is electrically connected in parallel.

In some embodiments, forming the at least one additional acoustic wave resonator includes electrically connecting the at least one additional acoustic wave resonator in parallel to one of the plurality of series arm acoustic wave resonators and forming the at least one additional acoustic wave resonator with a resonant frequency below a lower edge of a passband of the filter.

In some embodiments, forming the at least one additional acoustic wave resonator includes electrically connecting the at least one additional acoustic wave resonator in parallel to one of the plurality of parallel arm acoustic wave resonators and forming the at least one additional acoustic wave resonator with a resonant frequency above an upper edge of a passband of the filter.

In some embodiments, the plurality of series arm acoustic wave resonators, the plurality of parallel arm acoustic wave resonators, and the at least one additional acoustic wave resonator are surface acoustic wave (SAW) resonators having interdigital transducer (IDT) electrodes disposed on a piezoelectric substrate and the method further comprises depositing a film of silicon dioxide on the IDT electrodes of each of the plurality of series arm acoustic wave resonators, the plurality of parallel arm acoustic wave resonators, and the at least one additional acoustic wave resonator.

In some embodiments, forming the film of silicon dioxide on the IDT electrodes of the at least one additional acoustic wave resonator comprises forming a thicker film of silicon dioxide on the IDT electrodes of the at least one additional acoustic wave resonator than the films of silicon dioxide on the plurality of series arm acoustic wave resonators and the plurality of parallel arm acoustic wave resonators.

In some embodiments, the method further comprises forming films of silicon dioxide on the plurality of series arm acoustic wave resonators that are thinner than films of silicon dioxide formed on the plurality of parallel arm acoustic wave resonators.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Aspects and embodiments disclosed herein include filter structures for wireless communication devices, and methods of manufacturing same, that exhibit frequency passbands with sharp edges that are stable with regard to operating temperature, exhibiting low temperature coefficients of frequency (TCF). Such filters facilitate operation of wireless devices under communication standards having narrow bandgaps between transmission and reception frequency bands or having operating bands that are closely spaced to the operating bands of devices utilizing other standardized frequency bands. Aspects and embodiments disclosed herein exhibit improvement in TCF at the filter transition band without sacrificing passband width to realize telecommunications systems with narrow bandgap between transmission and reception bands and wide passbands. Aspects and embodiments disclosed herein provide improvements in TCF at both the upper and lower edges of filter passbands. Specific embodiments include ladder filter structures including acoustic wave elements with dielectric coating thicknesses selected to tune the TCF of the of the filter passband edges.

Aspects and embodiments disclosed herein include RF filters built on a piezoelectric substrate, for example, $LiNbO_3$ or $LiTaO_3$ and exhibiting a ladder structure including series and parallel resonators. The resonators may include surface acoustic wave (SAW) resonators including interleaved interdigital transducer (IDT) electrodes that are covered by a dielectric film, for example, $SiO_2$ or a combination of dielectric films, for example $SiO_2$ and $Si_3N_4$. The thickness of the dielectric film or films on different resonators in the filters may differ to provide enhanced TCF of the edges of the filter passbands as compared to similar filters having common dielectric thicknesses on all resonators. Aspects and embodiments disclosed herein will be described primarily with reference to SAW resonators, however, the concepts disclosed herein may equally apply to RF filters including bulk acoustic wave (BAW) resonators.

Figure 1A:
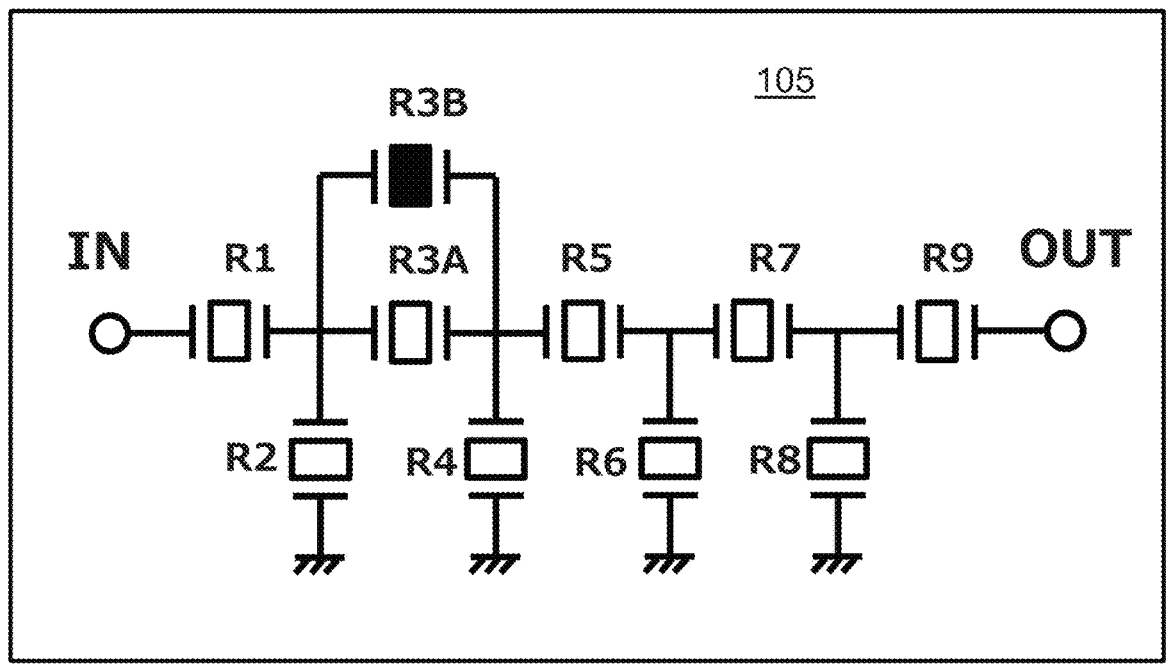
FIG. 1A is a schematic view of an electronic filter.

A first embodiment is illustrated in FIGS. 1A-ID. The filter of FIG. 1A includes a plurality of acoustic wave resonators R1, R2, R3A, R3B, R4, R5, R6, R7, R8, R9 disposed on a piezoelectric substrate 105 between an input port (IN) and an output port (OUT). The piezoelectric substrate may include, for example, $LiNbO_3$ or $LiTaO_3$. Resonators R1, R3A, R5, R7, and R9 are connected in series between the input port and output port. Resonators R2, R4, R6, and R8 are connected in parallel between resonators R1, R3A, R5, R7, and R9 and ground. An additional series resonator R3B is provided in parallel with resonator R3A. Resonator R3B has a resonant frequency lower than the lower edge of the passband of the filter. Resonator R3B has a lower TCF than the other resonators in the filter.

Figure 1B:
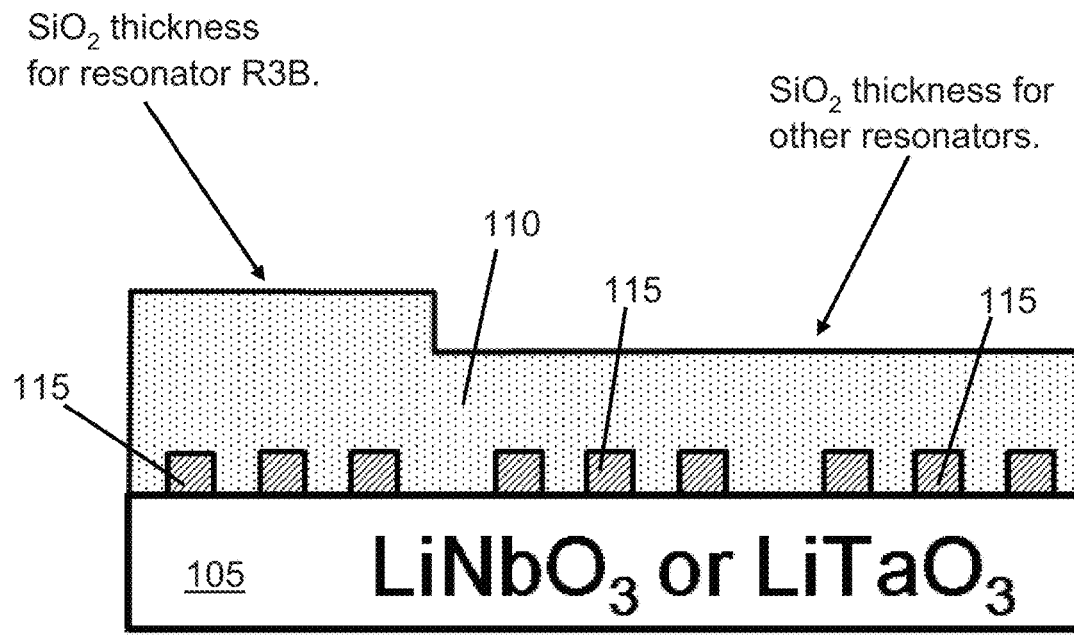
FIG. 1B is a cross-sectional view of a portion of the electronic filter of FIG. 1A.

Each of the acoustic wave resonators R1, R2, R3A, R3B, R4, R5, R6, R7, R8, and R9 are SAW resonators including IDT electrodes covered by a $SiO_2$ film. The IDT electrodes of each of resonators R1, R2, R3A, R4, R5, R6, R7, R8, and R9 are covered by an $SiO_2$ film having a first thickness, for example, a thickness normalized to the IDT electrode pitch $h_{SiO2}/\lambda$ of between about 20% and about 40%. As illustrated in FIG. 1B, the normalized thickness of the $SiO_2$ film 110 covering the IDT electrodes 115 of resonator R3B is different than the normalized thickness of the $SiO_2$ film covering the IDT electrodes 115 of the other resonators R1, R2, R3A, R4, R5, R6, R7, R8, and R9. The normalized thickness of the $SiO_2$ film covering the IDT electrodes of resonator R3B may be, for example, between about 1% to about 25% greater than the normalized thickness of the $SiO_2$ film covering the IDT electrodes of the other resonators R1, R2, R3A, R4, R5, R6, R7, R8, and R9. By describing the normalized thickness of the $SiO_2$ film covering the IDT electrodes of resonator R3B being between about 1% to about 25% greater than the normalized thickness of the $SiO_2$ film covering the IDT electrodes of the other resonators R1, R2, R3A, R4, R5, R6, R7, R8, and R9 it is meant that if the normalized thickness $h_{SiO2}/\lambda$ of the $SiO_2$ film covering the IDT electrodes of the other resonators R1, R2, R3A, R4, R5, R6, R7, R8, and R9 is, for example, 20%, the normalized thickness $h_{SiO2}/\lambda$ of the $SiO_2$ film covering the IDT electrodes of resonator R3B may be between about 21% and about 45%. A thicker $SiO_2$ film thickness will generally result in a lower acoustic velocity of acoustic waves in a SAW resonator. To compensate for the thicker $SiO_2$ film, the pitch of the IDT electrodes of resonator R3B may be reduced so that the resonant frequency of resonator R3B is lower than the lower edge of the passband of the filter.

In a method of fabrication of the filter of FIG. 1A, as well as the other filters disclosed herein, the $SiO_2$ film 110 covering the IDT electrodes of each of the resonators of the filter may be first deposited at a constant thickness over each of the resonators, and then selectively etched to provide the desired different $SiO_2$ film thicknesses over the different resonators.

Figure 1C:
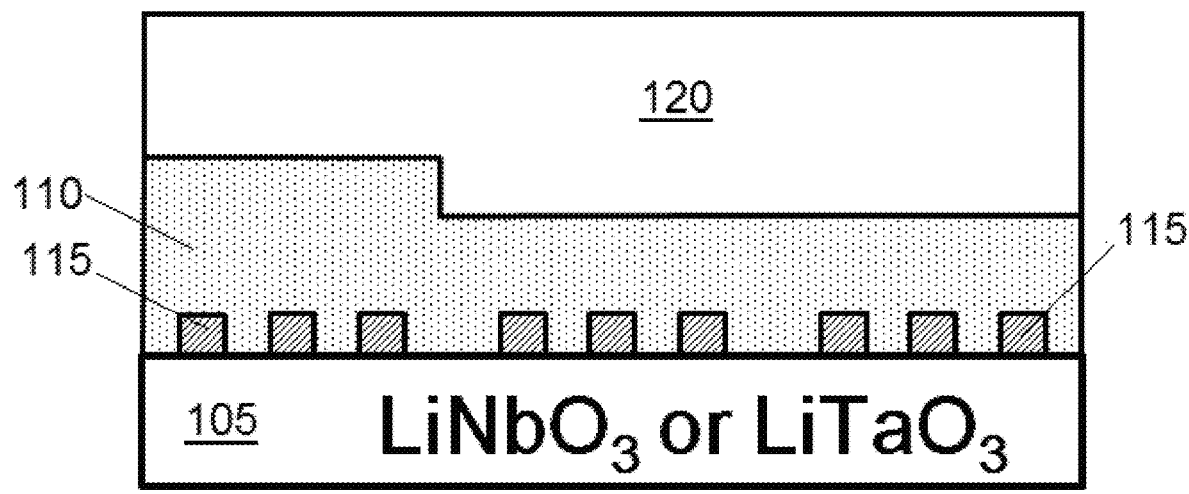
FIG. 1C is a cross-sectional view of a portion of an alternate embodiment of the electronic filter of FIG. 1A.

In some embodiments, as illustrated in FIG. 1C, the $SiO_2$ film 110 may be covered by a film of another dielectric 120 to provide for frequency trimming and environmental protection. Dielectric film 120 may be, for example, silicon nitride ($Si_3N_4$). Dielectric film 120 may have a normalized thickness $h_{Si3N4}/\lambda$ of between about 0.2% and about 3%. In some embodiments, the dielectric film 120 is planarized as illustrated in FIG. 1C. In other embodiments, the upper surface of the dielectric film 120 may conform to the contour of the stepped shape of the $SiO_2$ film 110. In other embodiments the dielectric film 120 may include an alternative dielectric material, for example, silicon oxynitride ($SiO_xN_y$) or a combination of $SiO_xN_y$ and $Si_3N_4$ films with the $SiO_xN_y$ film disposed between the $SiO_2$ and $Si_3N_4$ films or above the $Si_3N_4$ film. It is to be understood that a second dielectric film 120, for example, a $Si_3N_4$ film may be disposed over the $SiO_2$ film of any of the embodiments disclosed herein. For brevity, this second dielectric film 120 is not illustrated in the other disclosed embodiments.

Figure 1D:
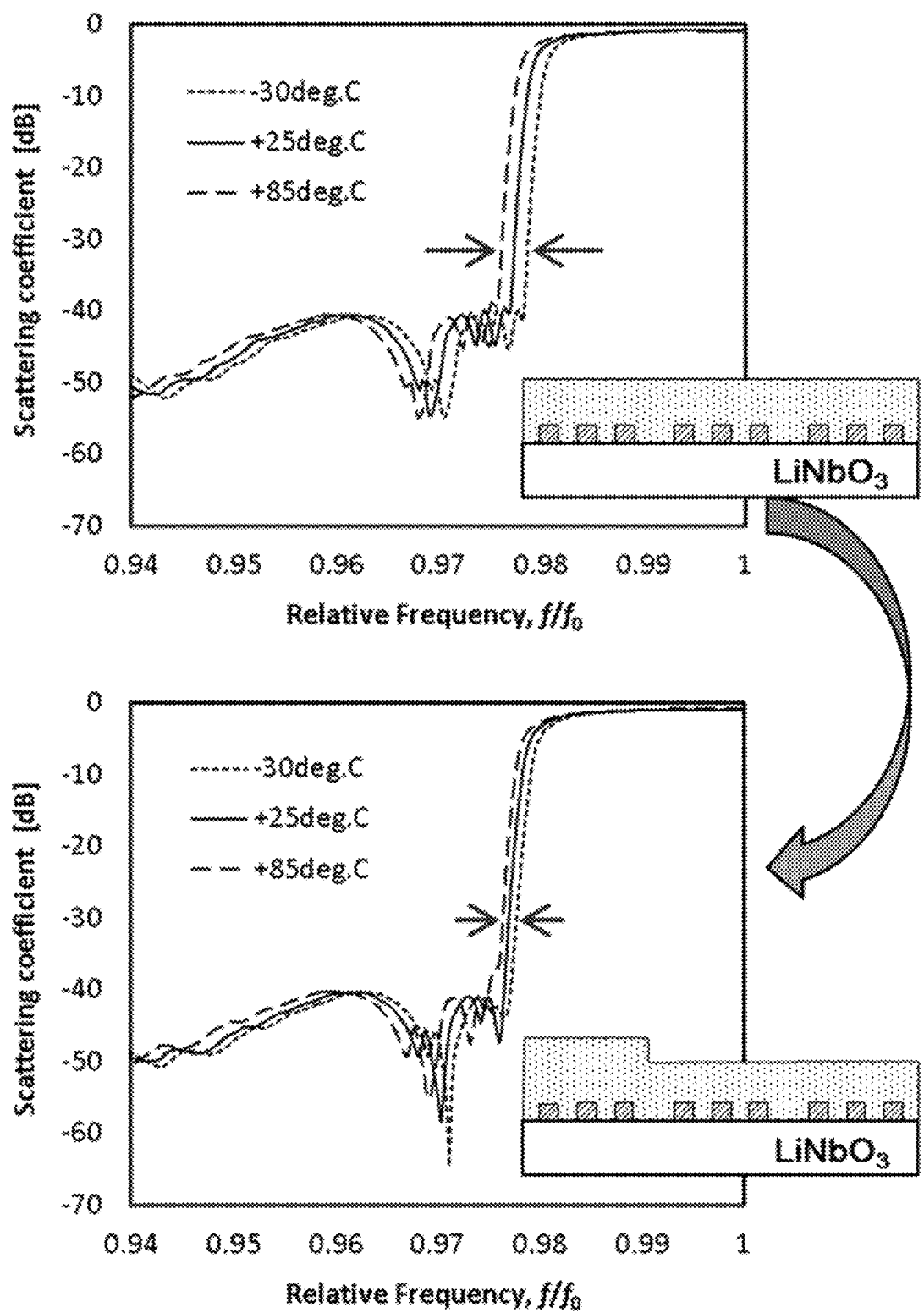
FIG. 1D illustrates an effect of temperature coefficient of frequency at the lower edge of a passband of the filter of FIG. 1A as compared to an alternate design.

Provision of the thicker $SiO_2$ film on the IDT electrodes of resonator R3B than on the remaining resonators in the filter of FIG. 1A improves the TCF of the lower edge of the passband of the filter. As illustrated in FIG. 1D, providing a thicker $SiO_2$ film on the IDT electrodes of resonator R3B than on the remaining resonators in the filter of FIG. 1 reduces a shift in frequency of the lower edge of the passband of the filter with temperature. The slope of the lower skirt of the passband of the filter may also be improved (increased) due to the provision of the thicker $SiO_2$ film on the IDT electrodes of resonator R3B than on the remaining resonators in the filter.

Figure 2A:
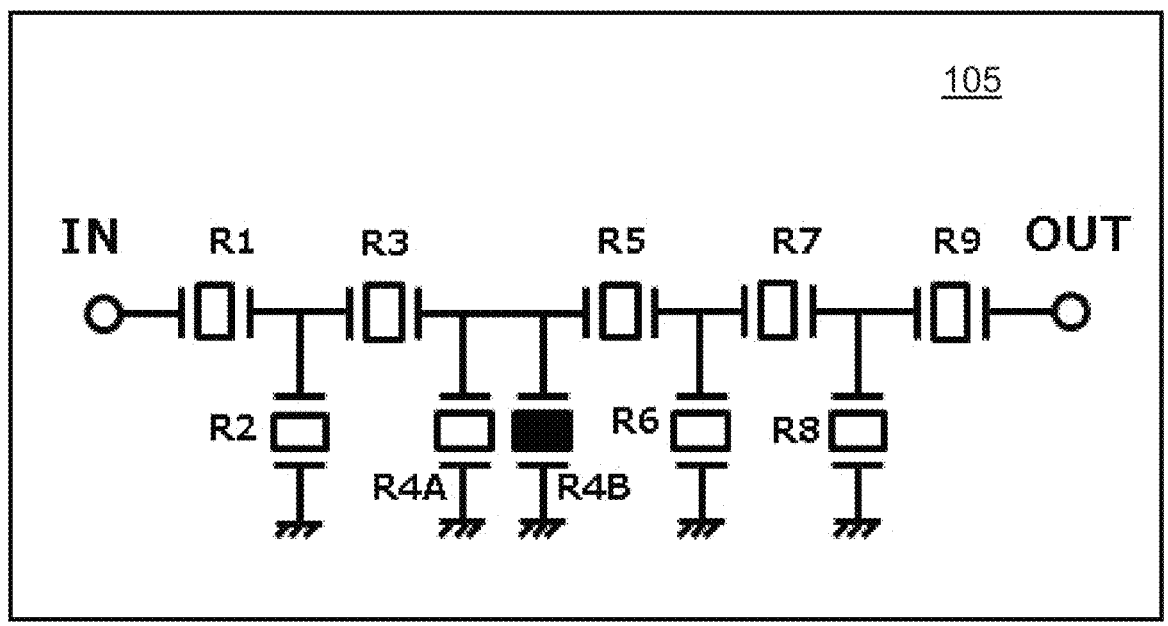
FIG. 2A is a schematic view of another electronic filter.
Figure 2B:
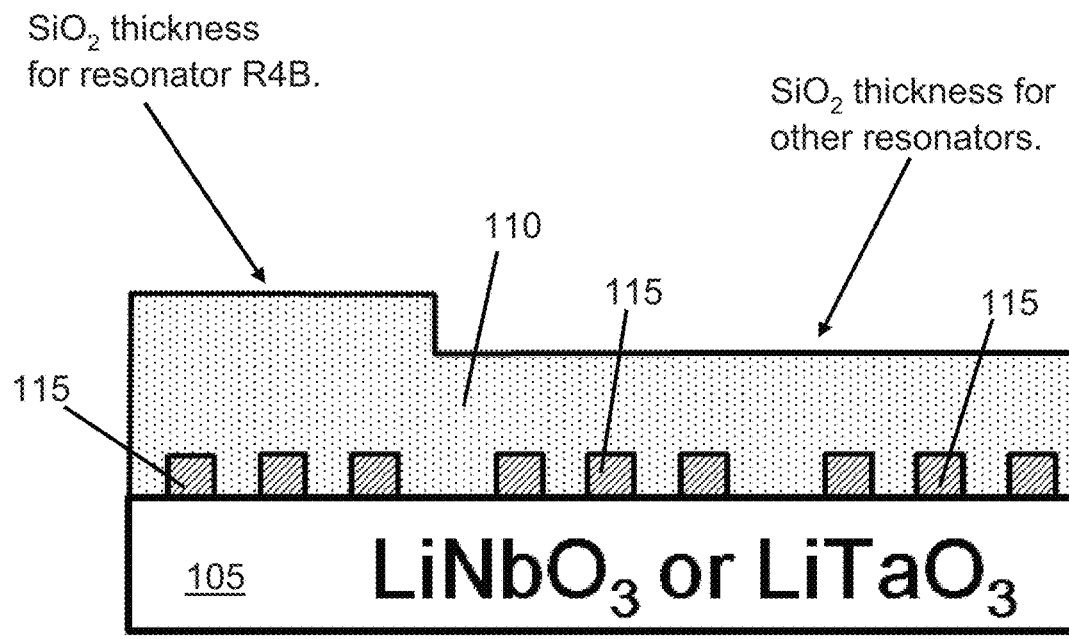
FIG. 2B is a cross-sectional view of a portion of the electronic filter of FIG. 2A.
Figure 2C:
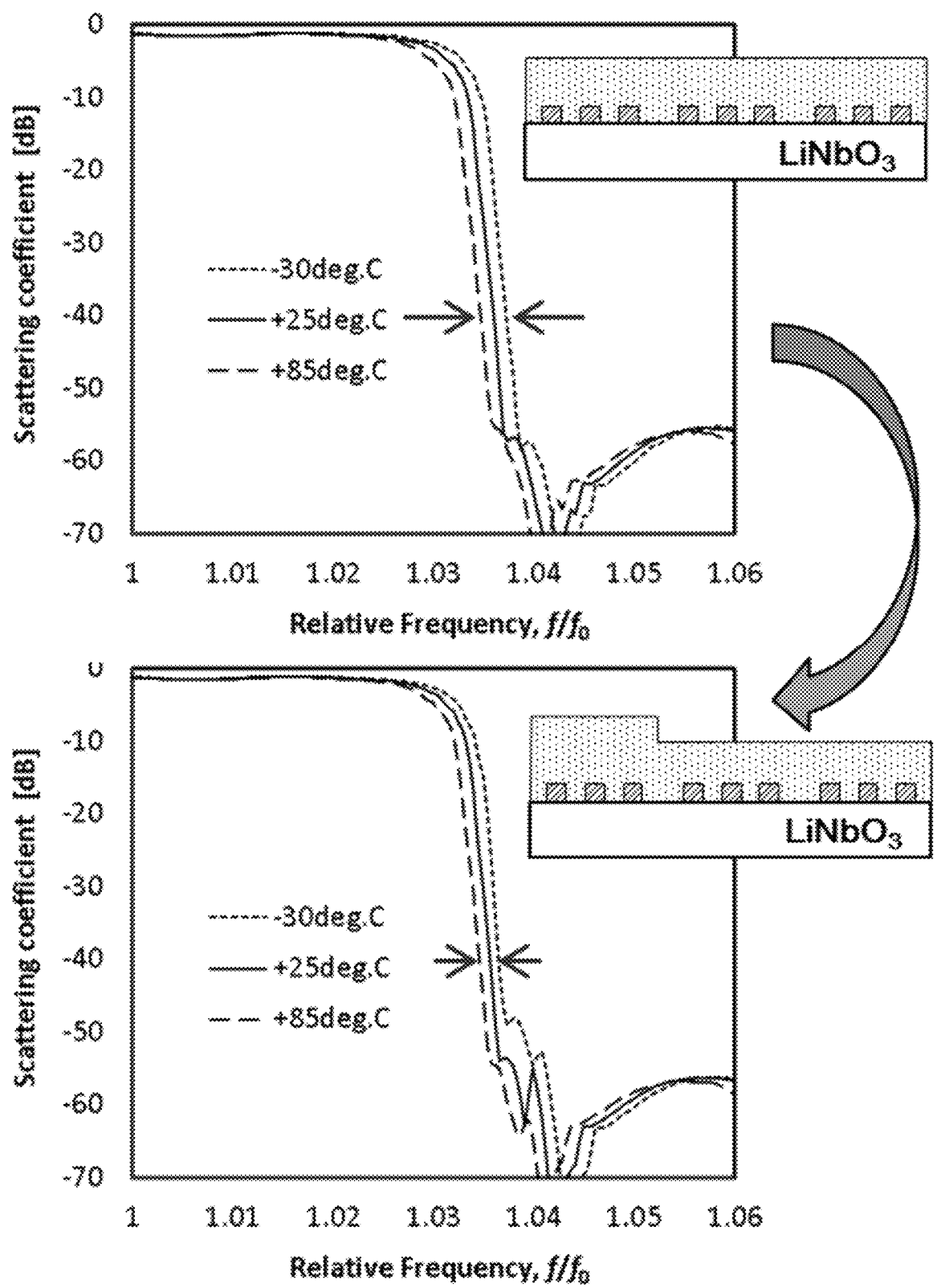
FIG. 2C illustrates an effect of temperature coefficient of frequency at the upper edge of a passband of the filter of FIG. 2A as compared to an alternate design.

A second embodiment is illustrated in FIGS. 2A-2C. The filter of FIG. 2A includes a plurality of acoustic wave resonators R1, R2, R3, R4A, R4B, R5, R6, R7, R8, and R9 disposed on a piezoelectric substrate 105 between an input port (IN) and an output port (OUT). The piezoelectric substrate may include, for example, $LiNbO_3$ or $LiTaO_3$. Resonators R1, R3, R5, R7, and R9 are connected in series between the input port and the output port. Resonators R2, R4A, R6, and R8 are connected in parallel between resonators R1, R3, R5, R7, and R9 and ground. An additional parallel resonator R4B is provided in parallel with resonator R4A. Resonator R4B has a resonant frequency above an upper edge of the passband of the filter. Resonator R4B has a lower TCF than the other resonators in the filter.

Each of the acoustic wave resonators R1, R2, R3, R4A, R4B, R5, R6, R7, R8, and R9 are SAW resonators including IDT electrodes covered by a $SiO_2$ film. The IDT electrodes of each of resonators R1, R2, R3, R4A, R5, R6, R7, R8, and R9 are covered by an $SiO_2$ film having a first thickness, for example, a thickness normalized to the IDT electrode pitch $h_{SiO2}/\lambda$ of between about 20% and about 40%. As illustrated in FIG. 2B, the normalized thickness of the $SiO_2$ film 110 covering the IDT electrodes 115 of resonator R4B is different than the normalized thickness of the $SiO_2$ film covering the IDT electrodes 115 of the other resonators R1, R2, R3, R4A, R5, R6, R7, R8, and R9. The normalized thickness of the $SiO_2$ film covering the IDT electrodes of resonator R4B may be, for example, between about 1% and about 25% greater than the normalized thickness of the $SiO_2$ film covering the IDT electrodes of the other resonators R1, R2, R3, R4A, R5, R6, R7, R8, and R9. A thicker SiO$_2$ film thickness will generally result in a lower acoustic velocity of acoustic waves in a SAW resonator. To compensate for the thicker SiO$_2$ film, the pitch of the IDT electrodes of resonator R4B may be reduced so that the resonant frequency of resonator R4B is located between an upper edge of the filter passband and the anti-resonance frequency of the series resonators R1, R3, R5, R7, and R9.

Provision of the thicker SiO$_2$ film on the IDT electrodes of resonator R4B than on the remaining resonators in the filter of FIG. 2A improves the TCF of the upper edge of the passband of the filter. As illustrated in FIG. 2C providing a thicker SiO$_2$ film on the IDT electrodes of resonator R4B than on the remaining resonators in the filter of FIG. 2A reduces a shift in frequency of the upper edge of the passband of the filter with temperature. The slope of the upper skirt of the passband of the filter may also be improved (increased) due to the provision of the thicker SiO$_2$ film on the IDT electrodes of resonator R4B than on the remaining resonators in the filter.

Figure 3:
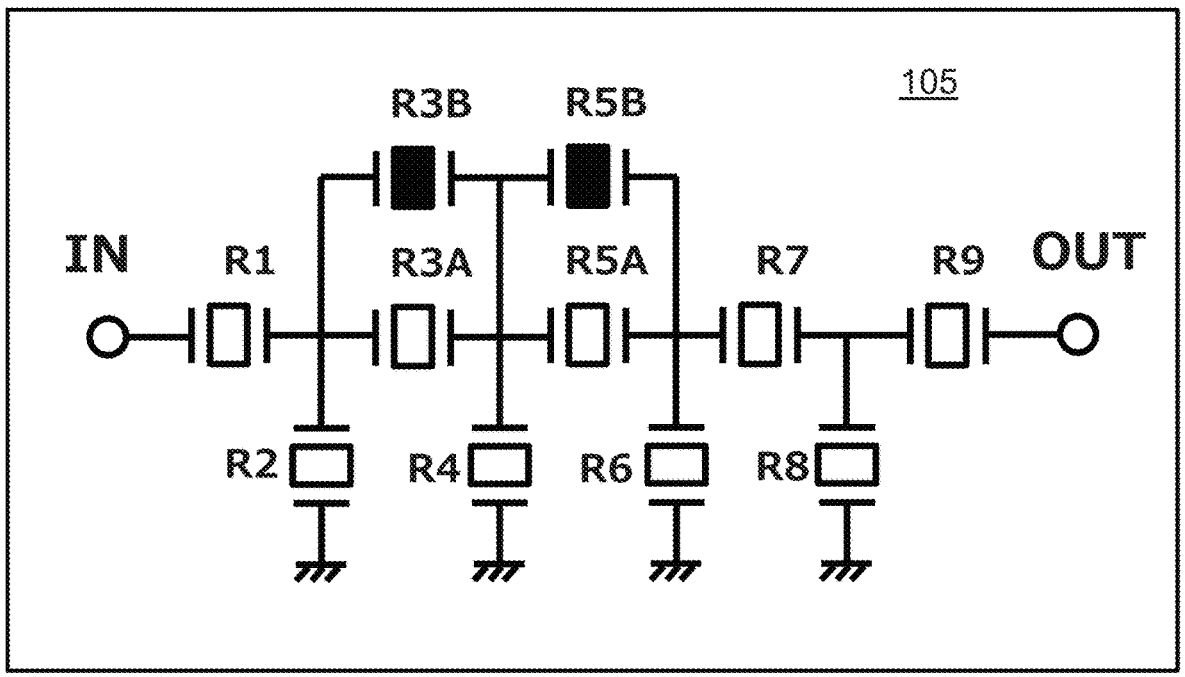
FIG. 3 is a schematic view of another electronic filter.

A third embodiment is illustrated in FIG. 3. The filter of FIG. 3 includes a plurality of acoustic wave resonators R1, R2, R3A, R3B, R4, R5A, R5B, R6, R7, R8, R9 disposed on a piezoelectric substrate 105 between an input port (IN) and an output port (OUT). The piezoelectric substrate may include, for example, LiNbO$_3$ or LiTaO$_3$. Resonators R1, R3A, R5A, R7, and R9 are connected in series between the input port and the output port. Resonators R2, R4, R6, and R8 are connected in parallel between resonators R1, R3A, R5A, R7, and R9 and ground. Two additional series resonators R3B and R5B are provided in parallel with resonators R3A and R5A, respectively. Resonators R3B and R5B have resonant frequencies lower than the lower edge of the passband of the filter. Resonators R3B and R5B have lower TCFs than the other resonators in the filter.

Each of the acoustic wave resonators R1, R2, R3A, R3B, R4, R5A, R5B, R6, R7, R8, and R9 are SAW resonators including IDT electrodes covered by a SiO$_2$ film. The IDT electrodes of each of resonators R1, R2, R3A, R4, R5A, R6, R7, R8, and R9 are covered by an SiO$_2$ film having a first thickness, for example, a thickness normalized to the IDT electrode pitch $h_{SiO2}/\lambda$ of between about 20% and about 40%. The normalized thickness of the SiO$_2$ film covering the IDT electrodes of resonators R3B and R5B is different than the normalized thickness of the SiO$_2$ film covering the IDT electrodes of the other resonators R1, R2, R3A, R4, R5A, R6, R7, R8, and R9. The normalized thickness of the SiO$_2$ film covering the IDT electrodes of resonators R3B and R5B may be, for example, between about 1% and about 25% greater than the normalized thickness of the SiO$_2$ film covering the IDT electrodes of the other resonators R1, R2, R3A, R4, R5A, R6, R7, R8, and R9. A thicker SiO$_2$ film thickness will generally result in a lower acoustic velocity of acoustic waves in a SAW resonator. To compensate for the thicker SiO$_2$ film, the pitch of the IDT electrodes of resonators R3B and R5B may be reduced so that the resonant frequencies of resonators R3B and R5B are lower than the lower edge of the passband of the filter.

Provision of the thicker SiO$_2$ film on the IDT electrodes of resonators R3B and R5B than on the remaining resonators in the filter of FIG. 3 improves the TCF of the lower edge of the passband of the filter. Providing a thicker SiO$_2$ film on the IDT electrodes of resonators R3B and R5B than on the remaining resonators in the filter of FIG. 3 reduces a shift in frequency of the lower edge of the passband of the filter with temperature.

Figure 4:
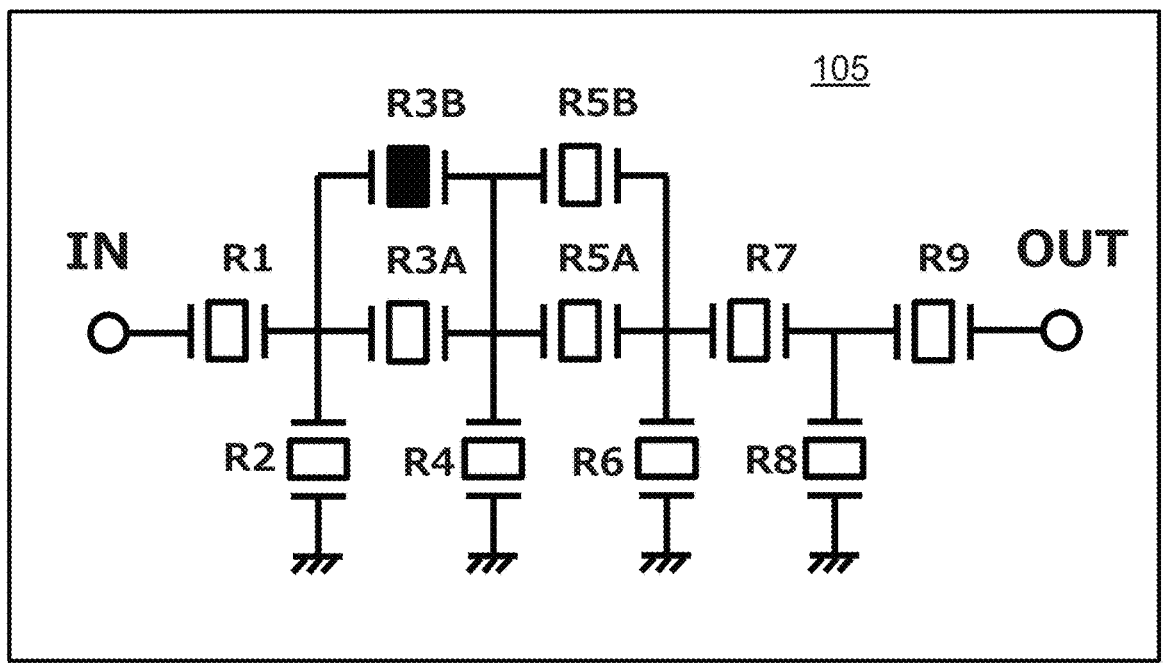
FIG. 4 is a schematic view of another electronic filter.

A fourth embodiment is illustrated in FIG. 4. This embodiment is similar to that of FIG. 3 except the SiO$_2$ film thickness of each of resonators R1, R2, R3A, R4, R5A, R5B, R6, R7, R8, and R9 is the same. The SiO$_2$ film thickness of resonator R3B may be, for example, between about 1% and about 25% greater than the normalized thickness of the SiO$_2$ film covering the IDT electrodes of the other resonators R1, R2, R3A, R4, R5A, R5B, R6, R7, R8, and R9. Resonator R3B has a resonant frequency lower than the lower edge of the passband of the filter. Resonator R3B has a lower TCF than the other resonators in the filter. The IDT electrode pitch of resonator R5B may be similar to that of the parallel resonators R2, R4, R6, and R8. The IDT electrode pitch of resonator R3B may be decreased relative to that of the parallel resonators R2, R4, R6, and R8 so that resonator R3B has a resonant frequency lower than the lower edge of the passband of the filter.

Provision of the thicker SiO$_2$ film on the IDT electrodes of resonator R3B than on the remaining resonators in the filter of FIG. 4 improves the TCF of the lower edge of the passband of the filter. Providing a thicker SiO$_2$ film on the IDT electrodes of resonator R3B than on the remaining resonators in the filter of FIG. 4 reduces a shift in frequency of the lower edge of the passband of the filter with temperature. Further, in the embodiment of FIG. 4, the fly-back at higher temperature generated due to the TCF difference between the parallel-arm resonators and the resonator R3B having greater SiO$_2$ thickness added in parallel to the series-arm resonator can be reduced. As this term is used herein, fly-back refers to a bump or spike or rise in the rejection level out-of-band. This level typically rises (gets worse) away from the passband in frequency.

Figure 5A:
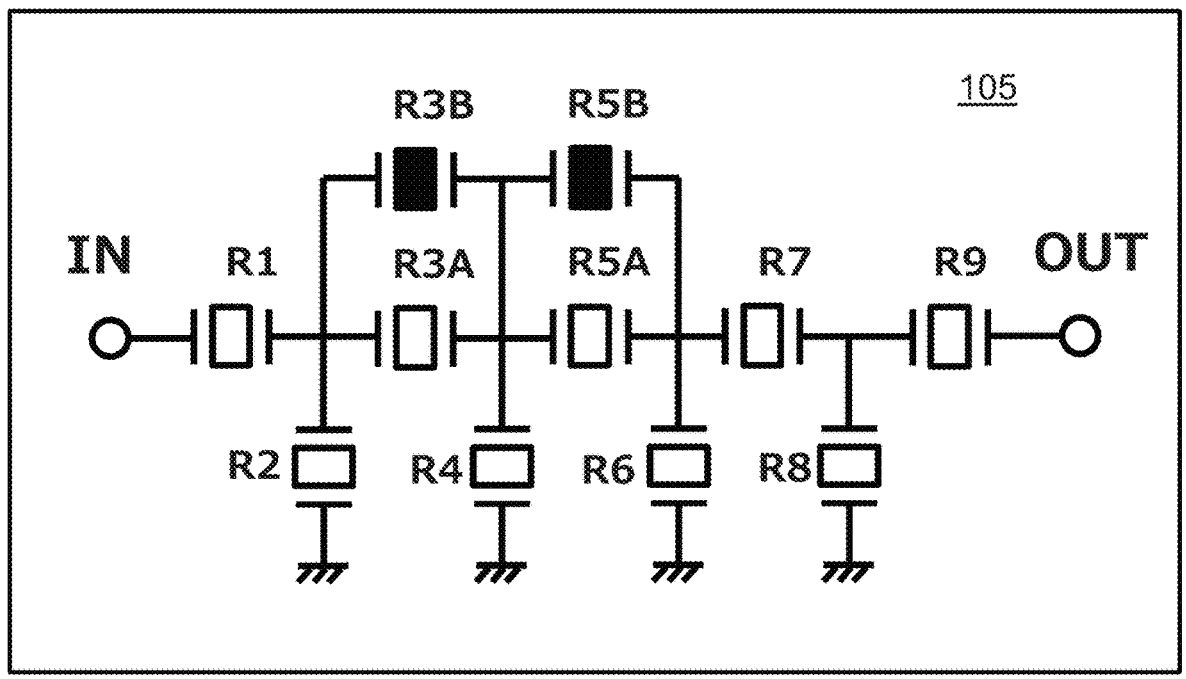
FIG. 5A is a schematic view of another electronic filter.
Figure 5B:
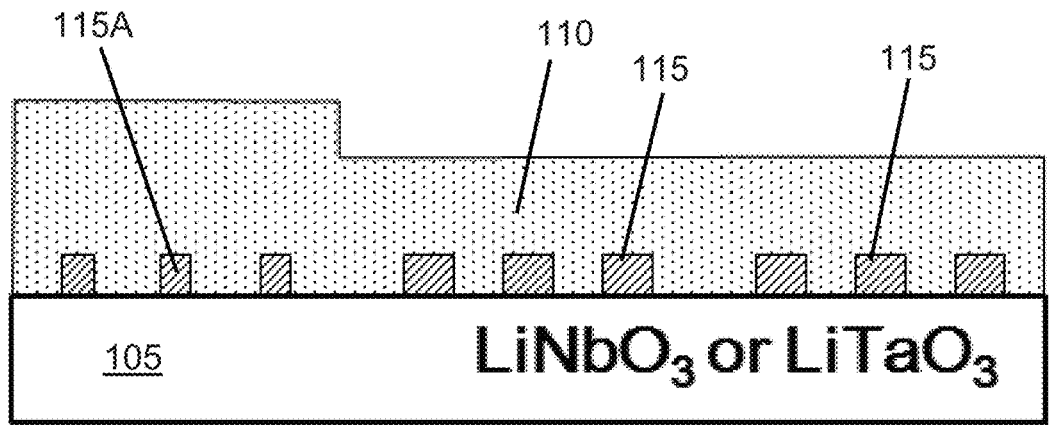
FIG. 5B is a cross-sectional view of a portion of the electronic filter of FIG. 5A.

A fifth embodiment is illustrated in FIG. 5A and FIG. 5B. This embodiment is similar to the embodiment illustrated in FIG. 3, however, as illustrated in FIG. 5B, the line width of the IDT electrodes 115A of the resonators R3B and R5B added in parallel to the series-arm resonators R3A and R5A, respectively, is reduced relative to the line widths of the IDT electrodes 115 of the other resonators, which may be substantially identical to one another. The line widths of the IDT electrodes 115A of resonators R3B and R5B are least among all resonators forming the filter. The reduced line width of the IDT electrodes 115A of resonators R3B and R5B may reduce the TCF of the resonators R3B and R5B making it possible to decrease the extent to which the SiO$_2$ film thickness of these resonators is increased relative to the other resonators to achieve equivalent performance to the embodiment illustrated in FIG. 3. The thickness of the SiO$_2$ film covering the IDT electrodes of the resonators R3B and R5B may be between about 0% (no difference) and about 25% greater than the thickness of the SiO$_2$ film covering the IDT electrodes of the other resonators in the filter, depending on how much thinner the IDT electrodes of the resonators R3B and R5B are relative to the IDT electrodes of the other resonators in the filter. The reduction of IDT electrode line width for the resonators R3B and R5B added in parallel to the series-arm resonators R3A and R5A in the embodiment of FIG. 5A and FIG. 5B may also be applicable to the embodiments illustrated in FIGS. 1A-ID, FIG. 3 and FIG. 4. In other embodiments, the line widths of the IDT electrodes of only one of resonators R3B and R5B, for example, resonator R3B only, are reduced relative to the line widths of the IDT electrodes 115 of the other resonators, which may be substantially identical to one another.

Figure 6A:
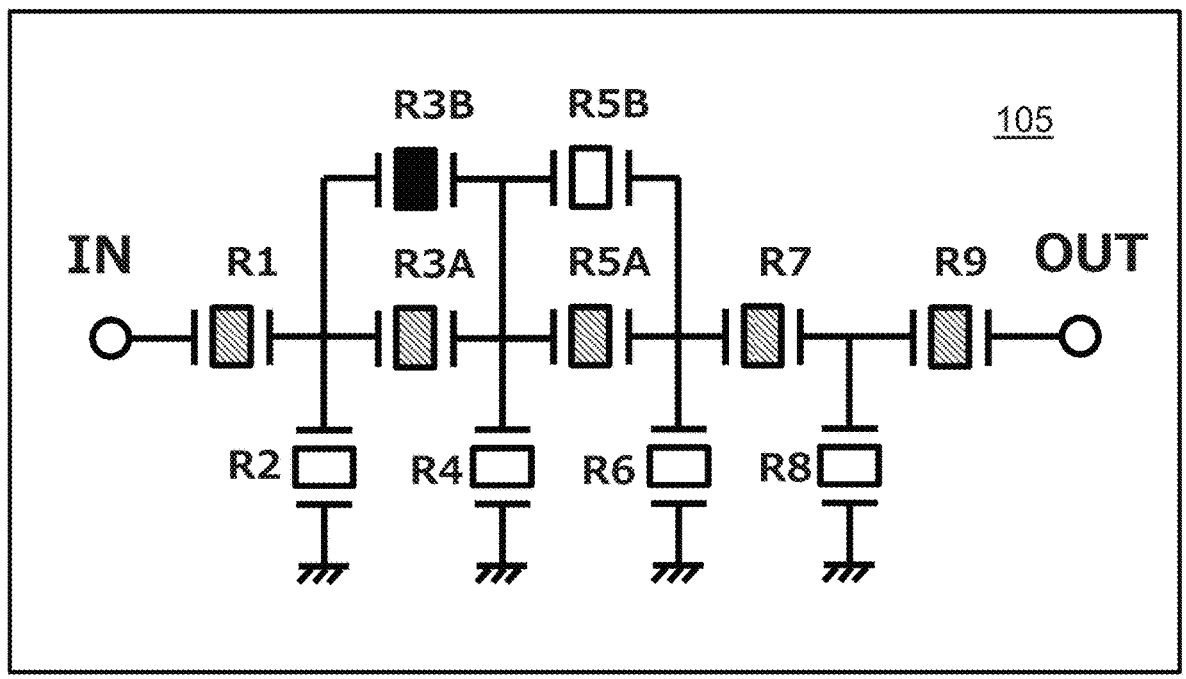
FIG. 6A is a schematic view of another electronic filter.
Figure 6B:
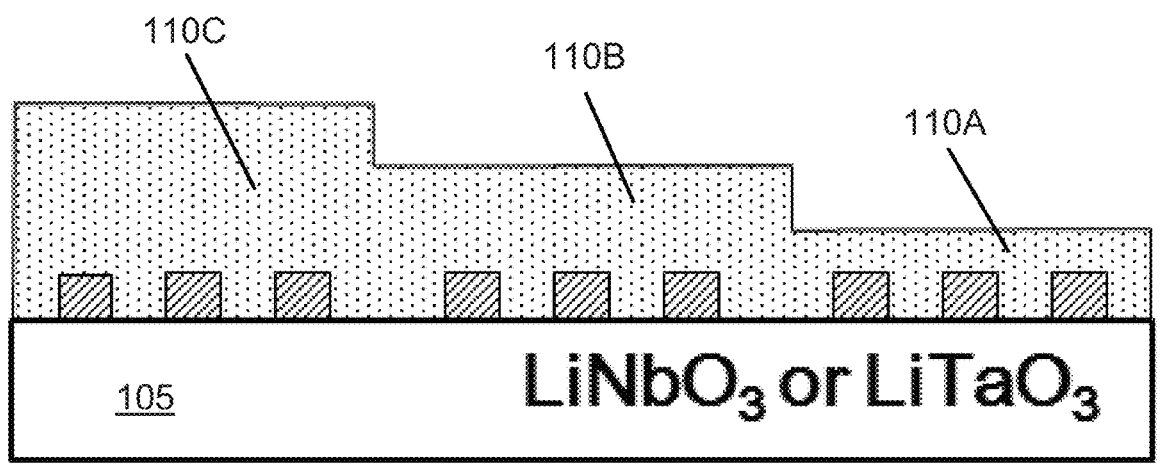
FIG. 6B is a cross-sectional view of a portion of the electronic filter of FIG. 6A.
Figure 7A:
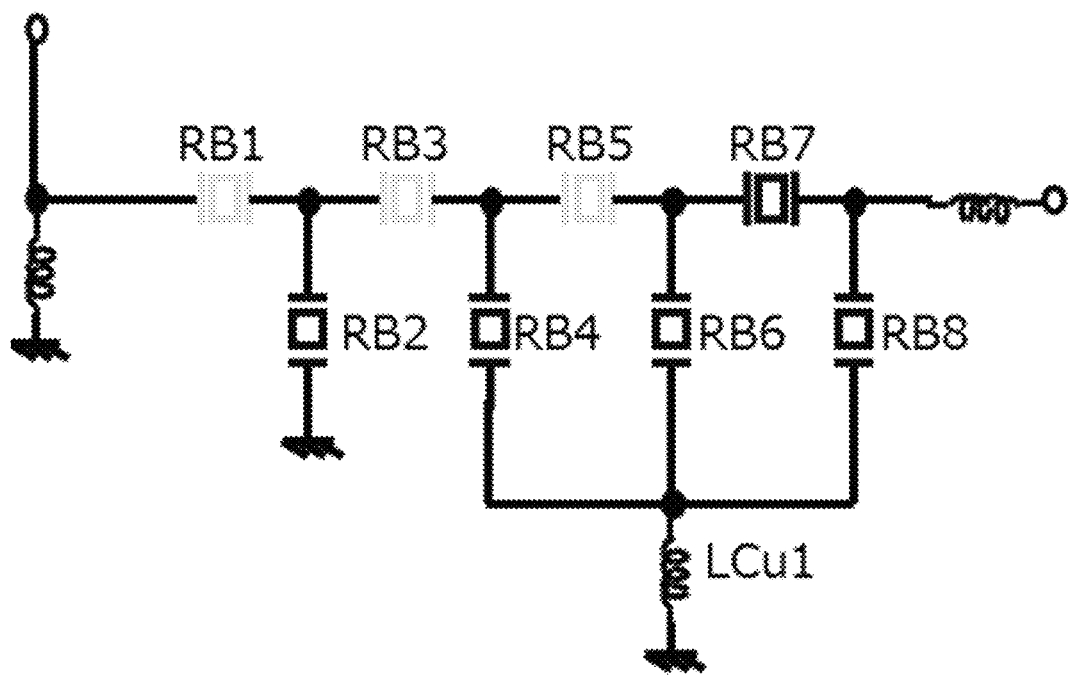
FIG. 7A is a schematic view of another electronic filter.
Figure 7B:
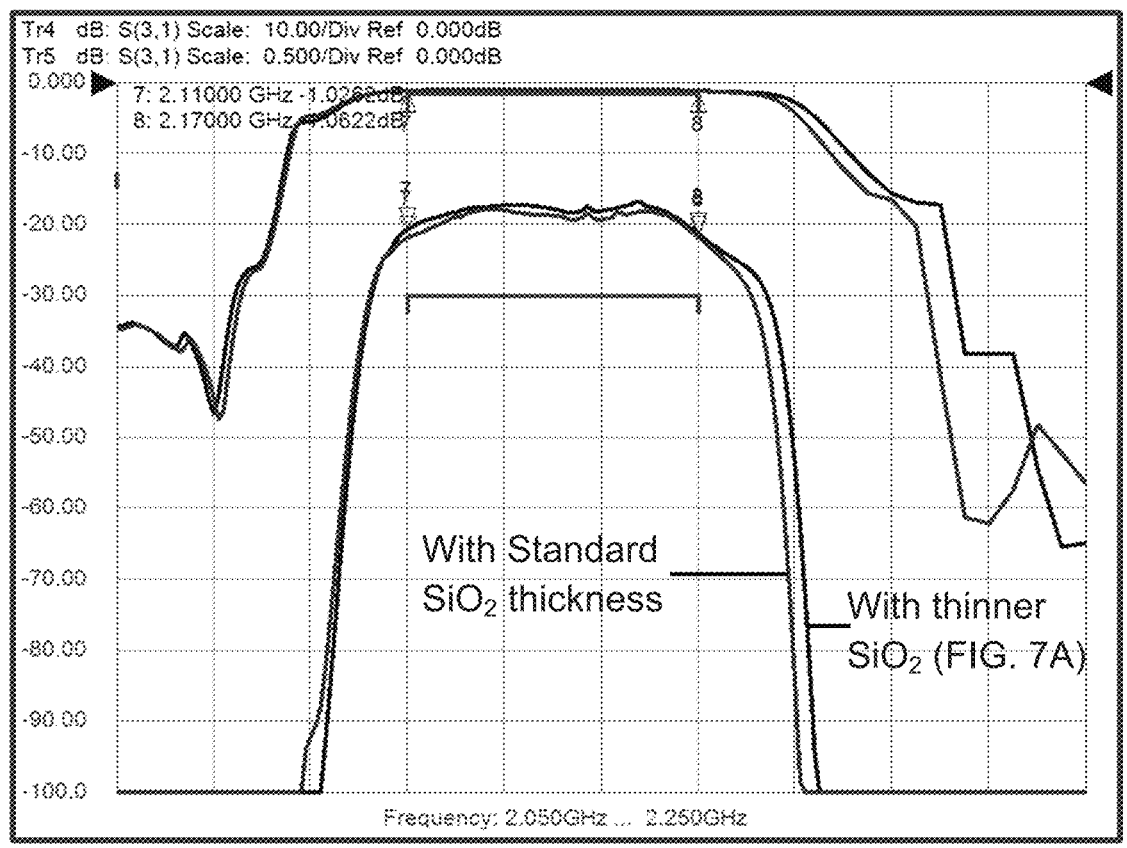
FIG. 7B illustrates a width of the passband of the filter of FIG. 7A as compared to an alternate design.

A sixth embodiment is illustrated in FIG. 6A and FIG. 6B. This embodiment may include any of the features of the embodiments illustrated in FIGS. 1A-ID, FIG. 3, FIG. 4, or FIG. 5A and FIG. 5B. Additionally, the thickness of the SiO$_2$ film 110A of the series resonators R1, R3A, R5A, R7, and R9 are reduced relative to the thicknesses of the SiO$_2$ films of the remaining resonators. The resonators R3B and R5B added in parallel to the series-arm resonators R3A and R5A may have the thickest SiO$_2$ films 110C, the parallel resonators R2, R4, R6, and R8 may have intermediate SiO$_2$ film 110B thicknesses, and the series resonators R1, R3A, R5A, R7, and R9 may have SiO$_2$ film 110A thicknesses reduced relative to that of the parallel resonators R2, R4, R6, and R8 by, for example, about 5% to about 50%. The embodiment illustrated in FIG. 6A and FIG. 6B may provide similar benefits with regard to reducing a shift in frequency of the lower edge of the passband of the filter with temperature as the embodiments illustrated in FIGS. 1A-1D, FIG. 3, FIG. 4, or FIG. 5A and FIG. 5B and may additionally provide a wider passband. For example, in a similar filter illustrated in FIG. 7A, the thickness of the SiO$_2$ films covering the IDT electrodes of the series-arm resonators RB1, RB3, RB5 were reduced relative to the thickness of the SiO$_2$ films covering the IDT electrodes of the parallel resonators RB2, RB4, RB6, RB8, and the additional series arm resonator RB7. The passband of the filter of FIG. 7A increased as illustrated in FIG. 7B, which includes a curve of the passband of a filter similar to that of FIG. 7A but where all resonators had similar SiO$_2$ film thicknesses and a curve of the passband of the modified filter of FIG. 7A. It should be appreciated that in various embodiments that are reflected by FIG. 6A, the line widths of resonator R3B, and in some examples, of both R3B and R5B may be reduced as described with reference to FIG. 5B.

Figure 8:
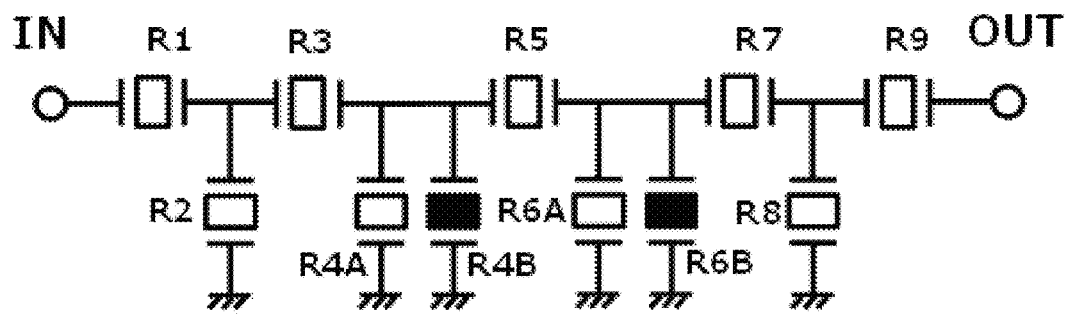
FIG. 8 is a schematic view of another electronic filter.

An eighth embodiment is illustrated in FIG. 8. The filter of FIG. 8 includes a plurality of acoustic wave resonators R1, R2, R3, R4A, R4B, R5, R6A, R6B, R7, R8, and R9 disposed on a piezoelectric substrate 105 between an input port (IN) and an output port (OUT). The piezoelectric substrate may include, for example, LiNbO$_3$ or LiTaO$_3$. Resonators R1, R3, R5, R7, and R9 are connected in series between the input port and the output port. Resonators R2, R4A, R6A, and R8 are connected in parallel between resonators R1, R3, R5, R7, and R9 and ground. Additional parallel resonators R4B and R6B are provided in parallel with resonators R4A and R6A, respectively. Resonators R4B and R6B have resonant frequencies above the upper edge of the filter passband and below the anti-resonant frequencies of the series resonators R1, R3, R5, R7, and R9. Resonators R4B and R6B have lower TCFs that the other resonators in the filter.

Each of the acoustic wave resonators R1, R2, R3, R4A, R4B, R5, R6A, R6B, R7, R8, and R9 are SAW resonators including IDT electrodes covered by a SiO$_2$ film. The IDT electrodes of each of resonators R1, R2, R3, R4A, R5, R6A, R7, R8, and R9 are covered by an SiO$_2$ film having a first thickness, for example, a thickness normalized to the IDT electrode pitch $h_{SiO2}/\lambda$ of between about 20% and about 40%. The normalized thickness of the SiO$_2$ film covering the IDT electrodes of resonators R4B and R6B is different than the normalized thickness of the SiO$_2$ film covering the IDT electrodes of the other resonators R1, R2, R3, R4A, R5, R6A, R7, R8, and R9. The normalized thickness of the SiO$_2$ film covering the IDT electrodes of resonators R4B and R6B may be, for example, between about 1% and about 25% greater than the normalized thickness of the SiO$_2$ film covering the IDT electrodes of the other resonators R1, R2, R3, R4A, R5, R6A, R7, R8, and R9. A thicker SiO$_2$ film thickness will generally result in a lower acoustic velocity of acoustic waves in a SAW resonator. To compensate for the thicker SiO$_2$ film, the pitch of the IDT electrodes of resonators R4B and R6B may be reduced so that the resonant frequency of resonators R4B and R6B are above the upper edge of the passband of the filter.

Provision of the thicker SiO$_2$ film on the IDT electrodes of resonators R4B and R6B than on the remaining resonators in the filter of FIG. 8 improves the TCF of the upper edge of the passband of the filter. Providing a thicker SiO$_2$ film on the IDT electrodes of resonators R4B and R6B than on the remaining resonators in the filter of FIG. 8 reduces a shift in frequency of the upper edge of the passband of the filter with temperature.

Figure 9:
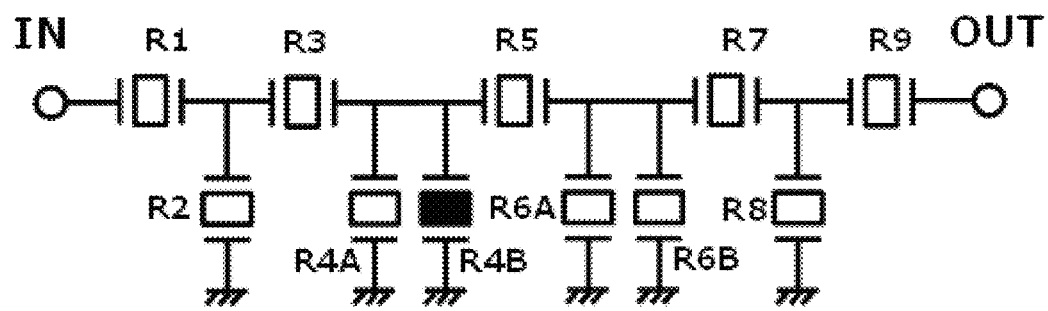
FIG. 9 is a schematic view of another electronic filter.

A ninth embodiment is illustrated in FIG. 9. This embodiment is similar to that of FIG. 8 except the SiO$_2$ film thickness of each of resonators R1, R2, R3, R4A, R5, R6A, R6B, R7, R8, and R9 is the same. The SiO$_2$ film thickness of resonator R4B may be, for example, between about 1% and about 25% greater than the normalized thickness of the SiO$_2$ film covering the IDT electrodes of the other resonators R1, R2, R3, R4A, R5, R6A, R6B, R7, R8, and R9. Resonator R4B has a resonant frequency similar to the resonant frequencies of the serial-arm resonators R1, R3, R5, R7, and R9. Resonator R4B has a TCF lower than the other resonators in the filter. The IDT electrode pitch of resonator R6B may be similar to that of the serial-arm resonators R1, R3, R5, R7, and R9. The IDT electrode pitch of resonator R4B may be decreased relative to that of the serial-arm resonators R1, R3, R5, R7, and R9 so that resonator R4B has a resonant frequency above the upper edge of the filter passband and below the anti-resonant frequencies of the serial-arm resonators R1, R3, R5, R7, and R9.

Provision of the thicker SiO$_2$ film on the IDT electrodes of resonator R4B than on the remaining resonators in the filter of FIG. 9 improves the TCF of the upper edge of the passband of the filter. Providing a thicker SiO$_2$ film on the IDT electrodes of resonator R3B than on the remaining resonators in the filter of FIG. 9 reduces a shift in frequency of the upper edge of the passband of the filter with temperature. Further, in the embodiment of FIG. 9, the fly-back at lower temperature generated due to the TCF difference between the series-arm resonators and the resonator R4B having greater SiO$_2$ thickness added in parallel to the parallel-arm resonator R4A can be reduced.

Figure 10A:
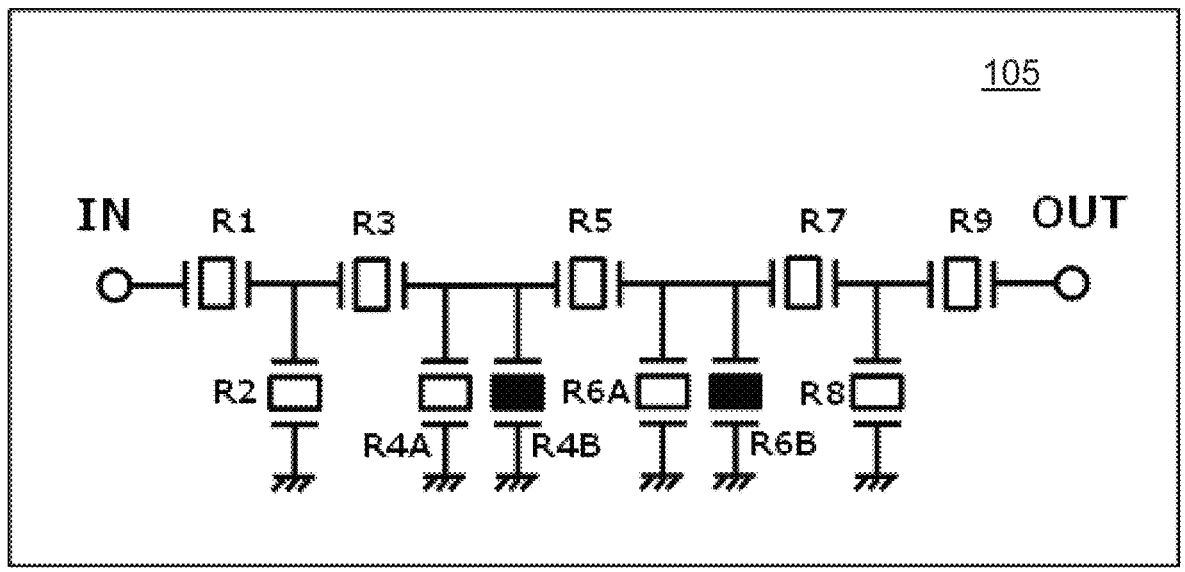
FIG. 10A is a schematic view of another electronic filter.
Figure 10B:
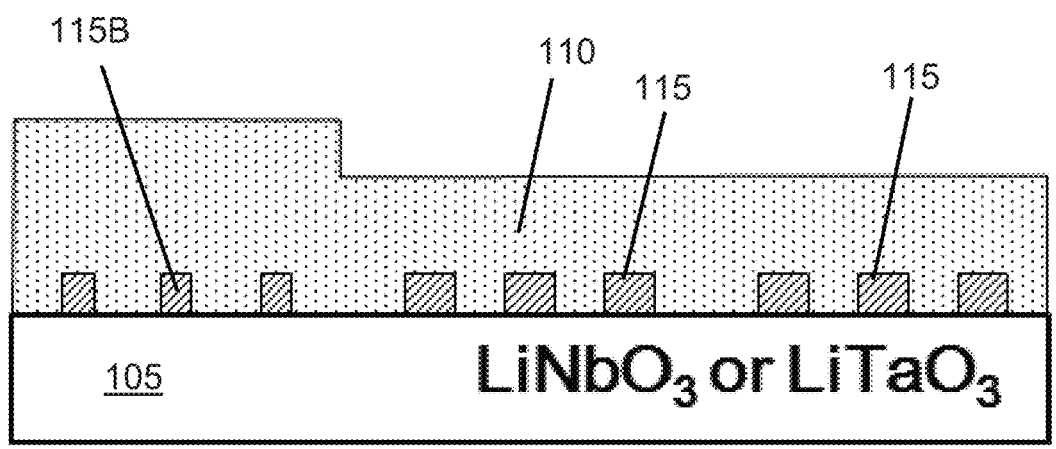
FIG. 10B is a cross-sectional view of a portion of the electronic filter of FIG. 10A.

A tenth embodiment is illustrated in FIG. 10A and FIG. 10B. This embodiment is similar to the embodiment illustrated in FIG. 8, however, as illustrated in FIG. 10B, the line width of the IDT electrodes 115B of the resonators R4B and R6B added in parallel to the parallel-arm resonators R4A and R6A, respectively, is reduced relative to the IDT line widths of the IDT electrodes 115 of the other resonators, which may be substantially identical to one another. The line widths of the IDT electrodes 115B of resonators R4B and R4B are least among all resonators forming the filter. The reduced line width of the IDT electrodes 115B of resonators R4B and R6B may reduce the TCF of the resonators R4B and R6B making it possible to decrease the extent to which the SiO$_2$ film thickness of these resonators is increased relative to the other resonators to achieve equivalent performance to the embodiment illustrated in FIG. 8. The thickness of the SiO$_2$ film covering the IDT electrodes of the resonators R4B and R6B may be between about 0% (no difference) and about 25% greater than the thickness of the SiO$_2$ film covering the IDT electrodes of the other resonators in the filter, depending on how much thinner the IDT electrodes of the resonators R4B and R6B are relative to the IDT electrodes of the other resonators in the filter. The reduction of IDT electrode line width for the resonators R4B and R6B added in parallel to the parallel-arm resonators R4A and R6A in the embodiment of FIG. 10A and FIG. 10B may also be applicable to the embodiments illustrated in FIGS. 2A-2C, FIG. 8, and FIG. 9.

Figure 11A:
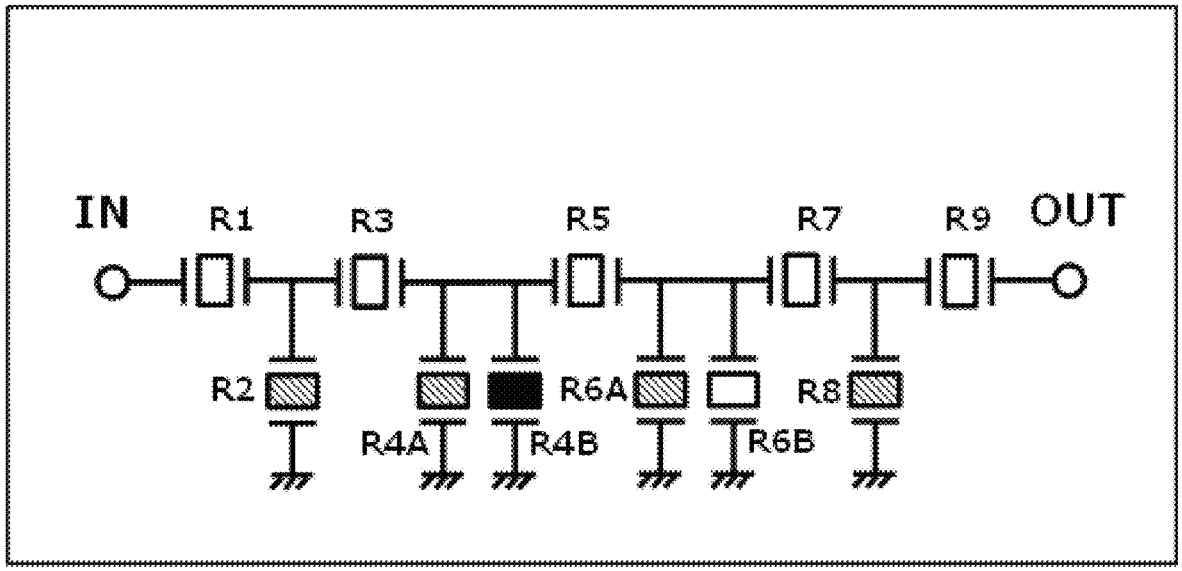
FIG. 11A is a schematic view of another electronic filter.
Figure 11B:
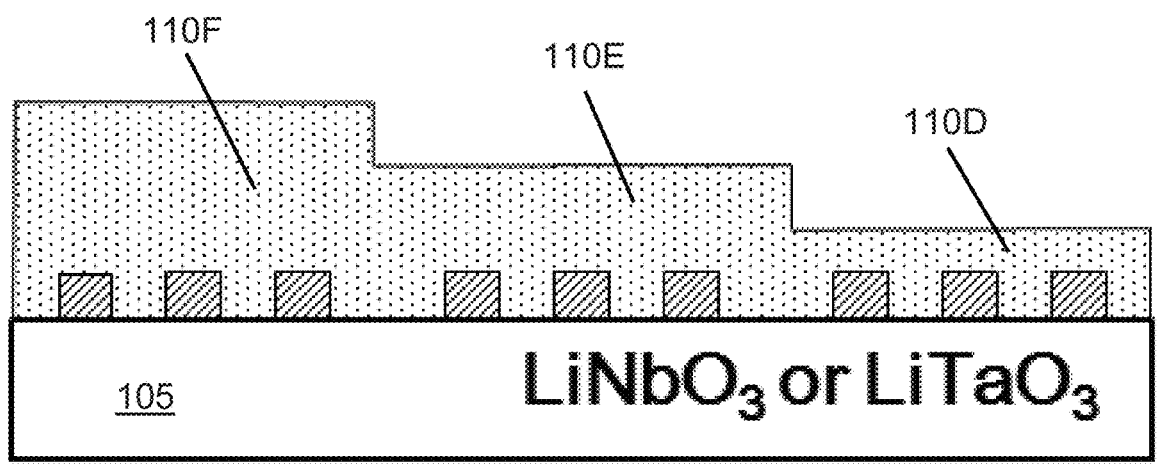
FIG. 11B is a cross-sectional view of a portion of the electronic filter of FIG. 11A.

An eleventh embodiment is illustrated in FIG. 11A and FIG. 11B. This embodiment may include any of the features of the embodiments illustrated in FIGS. 2A-2C, FIG. 8, FIG. 9, or FIG. 10A and FIG. 10B. Additionally, the thickness of the $SiO_2$ film 110D of the parallel resonators R2, R4A, R6A, and R8 are reduced relative to the thicknesses of the $SiO_2$ films of the series arm resonators R1, R3, R5, R7, and R9 and the parallel arm resonator R6B. The resonator R4B added in parallel to the parallel-arm resonator R4A may have the thickest $SiO_2$ film 110F, the series arm resonators R1, R3, R5, R7, and R9 and the parallel arm resonator R6B may have intermediate $SiO_2$ film 110E thicknesses, and the parallel resonators R2, R4A, R6A, and R8 may have $SiO_2$ film 110D thicknesses reduced relative to that of the of the series arm resonators R1, R3, R5, R7, and R9 and the parallel arm resonator R6B by, for example, between about 5% and about 50%. The embodiment illustrated in FIG. 11A and FIG. 11B may provide similar benefits with regard to reducing a shift in frequency of the upper edge of the passband of the filter with temperature as the embodiments illustrated in FIGS. 2A-2C, FIG. 8, FIG. 9, or FIG. 10A and FIG. 10B and may additionally provide a wider passband.

Filters as illustrated in any of the above referenced embodiments may be used in a wide range of electronic devices.

Figure 12:
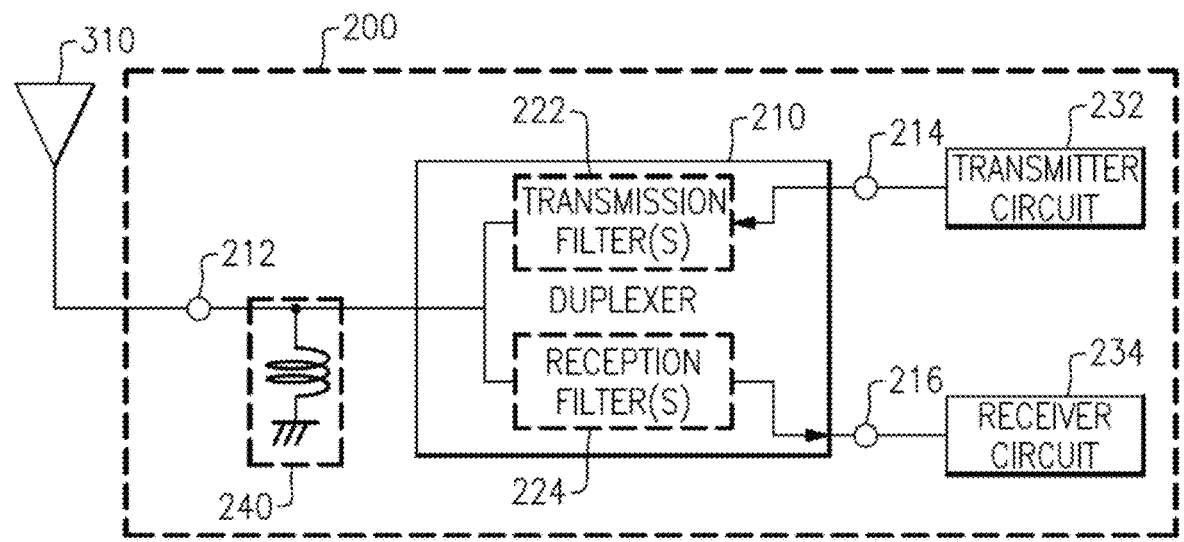
FIG. 12 is a block diagram of a front-end module in which any of the filters disclosed herein may be implemented.

Referring to FIG. 12, there is illustrated a block diagram of one example of a front-end module 200, which may be used in an electronic device such as a wireless communications device (e.g., a mobile phone) for example. The front-end module 200 includes an antenna duplexer 210 having a common node 212, an input node 214, and an output node 216. An antenna 310 is connected to the common node 212. The front-end module 200 further includes a transmitter circuit 232 connected to the input node 214 of the duplexer 210 and a receiver circuit 234 connected to the output node 216 of the duplexer 210. The transmitter circuit 232 can generate signals for transmission via the antenna 310, and the receiver circuit 234 can receive and process signals received via the antenna 310. In some embodiments, the receiver and transmitter circuits are implemented as separate components, as shown in FIG. 12; however in other embodiments these components may be integrated into a common transceiver circuit or module. As will be appreciated by those skilled in the art, the front-end module 200 may include other components that are not illustrated in FIG. 12 including, but not limited to, switches, electromagnetic couplers, amplifiers, processors, and the like.

The antenna duplexer 210 may include one or more transmission filters 222 connected between the input node 214 and the common node 212, and one or more reception filters 224 connected between the common node 212 and the output node 216. The passband(s) of the transmission filter(s) are different from the passband(s) of the reception filters. Each of the transmission filter(s) 222 and the reception filter(s) 224 may include an embodiment of a filter as disclosed herein. An inductor or other matching component 240 may be connected at the common node 212.

In certain examples, the acoustic wave elements used in the transmission filter 222 or the reception filter 224 are disposed on a single piezoelectric substrate. This structure reduces the effect of changes in temperature upon the frequency responses of the respective filter, in particular, reducing degradation in the passing or attenuation characteristics due to changes in the temperature, because each acoustic wave element changes similarly in response to changes in the ambient temperature. In addition, this arrangement may also allow the transmission filter 222 or reception filter 224 to have a small size.

Figure 13:
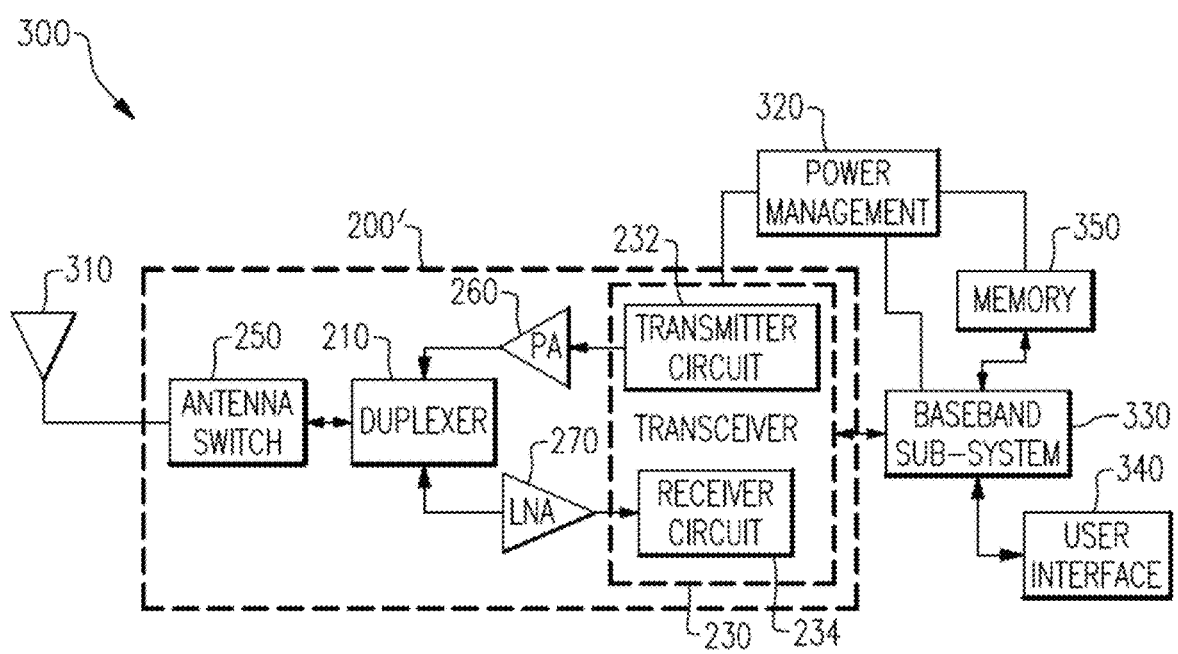
FIG. 13 is a block diagram of a wireless device in which any of the filters disclosed herein may be implemented.

FIG. 13 is a block diagram of one example of a wireless device 300 including the antenna duplexer 210 shown in FIG. 12. The wireless device 300 can be a cellular phone, smart phone, tablet, modem, communication network or any other portable or non-portable device configured for voice or data communication. The wireless device 300 can receive and transmit signals from the antenna 310. The wireless device includes an embodiment of a front-end module 200' similar to that discussed above with reference to FIG. 12. The front-end module 200' includes the duplexer 210, as discussed above. In the example shown in FIG. 13 the front-end module 200' further includes an antenna switch 250, which can be configured to switch between different frequency bands or modes, such as transmit and receive modes, for example. In the example illustrated in FIG. 13, the antenna switch 250 is positioned between the duplexer 210 and the antenna 310; however, in other examples the duplexer 210 can be positioned between the antenna switch 250 and the antenna 310. In other examples the antenna switch 250 and the duplexer 210 can be integrated into a single component.

The front end module 200' includes a transceiver 230 that is configured to generate signals for transmission or to process received signals. The transceiver 230 can include the transmitter circuit 232, which can be connected to the input node 214 of the duplexer 210, and the receiver circuit 234, which can be connected to the output node 216 of the duplexer 210, as shown in the example of FIG. 12.

Signals generated for transmission by the transmitter circuit 232 are received by a power amplifier (PA) module 260, which amplifies the generated signals from the transceiver 230. The power amplifier module 260 can include one or more power amplifiers. The power amplifier module 260 can be used to amplify a wide variety of RF or other frequency-band transmission signals. For example, the power amplifier module 260 can receive an enable signal that can be used to pulse the output of the power amplifier to aid in transmitting a wireless local area network (WLAN) signal or any other suitable pulsed signal. The power amplifier module 260 can be configured to amplify any of a variety of types of signal, including, for example, a Global System for Mobile (GSM) signal, a code division multiple access (CDMA) signal, a W-CDMA signal, a Long Term Evolution (LTE) signal, or an EDGE signal. In certain embodiments, the power amplifier module 260 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 13, the front-end module 200' may further include a low noise amplifier module 270, which amplifies received signals from the antenna 310 and provides the amplified signals to the receiver circuit 234 of the transceiver 230.

The wireless device 300 of FIG. 13 further includes a power management sub-system 320 that is connected to the transceiver 230 and manages the power for the operation of the wireless device 300. The power management system 320 can also control the operation of a baseband sub-system 330 and various other components of the wireless device 300. The power management system 320 can include, or can be connected to, a battery (not shown) that supplies power for the various components of the wireless device 300. The power management system 320 can further include one or more processors or controllers that can control the transmission of signals, for example. In one embodiment, the baseband sub-system 330 is connected to a user interface 340 to facilitate various input and output of voice and/or data provided to and received from the user. The baseband sub-system 330 can also be connected to memory 350 that is configured to store data and/or instructions to facilitate the operation of the wireless device, and/or to provide storage of information for the user.

Devices as disclosed herein that include SAW resonators may operate at frequencies of up to 3 GHz or higher, for example, between 800 MHz and 2.5 GHz. Devices as disclosed herein that include BAW resonators may operate at frequencies of up to 5 GHz or higher, for example, operating in frequencies with wavelengths in the range of from one to ten mm. Filters, modules, and devices disclosed herein may be utilized in fifth generation (5G) devices or circuits.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. It is to be appreciated that embodiments of the methods and apparatuses discussed herein are not limited in application to the details of construction and the arrangement of components set forth in the foregoing description or illustrated in the accompanying drawings. The methods and apparatuses are capable of implementation in other embodiments and of being practiced or of being carried out in various ways. Examples of specific implementations are provided herein for illustrative purposes only and are not intended to be limiting. One or more features of any embodiment disclosed herein may be added to or substituted for any one or more features of any other embodiment. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation. Accordingly, the foregoing description and drawings are by way of example only.

What is claimed is:

1. An electronic filter comprising:
   a plurality of series arm acoustic wave resonators electrically connected in series between an input port and an output port;
   a plurality of parallel arm acoustic wave resonators electrically connected in parallel and electrically connected on first sides between respective ones of the plurality of series arm acoustic wave resonators and electrically connected on second sides to ground; and
   at least one additional acoustic wave resonator including a first additional acoustic wave resonator electrically connected in parallel to a first one of the plurality of series arm acoustic wave resonators and a second additional acoustic wave resonator electrically connected in parallel to a second one of the plurality of series arm acoustic wave resonators, at least one of the first and second additional acoustic wave resonators having a temperature coefficient of frequency (TCF) lower than a TCF of the acoustic wave resonator to which it is electrically connected in parallel, the plurality of series arm acoustic wave resonators, the plurality of parallel arm acoustic wave resonators, and the at least one additional acoustic wave resonator being surface acoustic wave (SAW) resonators having interdigital transducer (IDT) electrodes disposed on a piezoelectric substrate, the IDT electrodes of the plurality of series arm acoustic wave resonators, the plurality of parallel arm acoustic wave resonators, and the at least one additional acoustic wave resonator being covered by silicon dioxide ($SiO_2$), the IDT electrodes of the at least one additional acoustic wave resonator being covered by a thicker layer of $SiO_2$ than the IDT electrodes of the plurality of series arm acoustic wave resonators and the IDT electrodes of the plurality of parallel arm acoustic wave resonators.

2. The filter of claim 1 wherein the at least one additional acoustic wave resonator has a resonant frequency lower than a lower edge of a passband of the filter.

3. The filter of claim 1 further comprising at least one additional acoustic wave resonator electrically connected in parallel to one of the plurality of parallel arm acoustic wave resonators and having a resonant frequency above an upper edge of a passband of the filter.

4. The filter of claim 3 wherein the at least one additional acoustic wave resonator includes a third additional acoustic wave resonator electrically connected in parallel to a first one of the plurality of parallel arm acoustic wave resonators and a fourth additional acoustic wave resonator electrically connected in parallel a second one of the plurality of parallel arm acoustic wave resonators.

5. The filter of claim 4 wherein each of the third additional acoustic wave resonator and the fourth additional acoustic wave resonator has a TCF lower than the first one of the plurality of parallel arm acoustic wave resonators and the second one of the plurality of parallel arm acoustic wave resonators.

6. The filter of claim 4 wherein only one of the third additional acoustic wave resonator and the fourth additional acoustic wave resonator has a TCF lower than the first one of the plurality of parallel arm acoustic wave resonators and the second one of the plurality of parallel arm acoustic wave resonators.

7. The filter of claim 1 wherein each of the first additional acoustic wave resonator and the second additional acoustic wave resonator has a TCF lower than the first one of the plurality of series arm acoustic wave resonators and the second one of the plurality of series arm acoustic wave resonators.

8. The filter of claim 1 wherein only one of the first additional acoustic wave resonator and the second additional acoustic wave resonator has a TCF lower than the first one of the plurality of series arm acoustic wave resonators and the second one of the plurality of series arm acoustic wave resonators.

9. The filter of claim 1 wherein the IDT electrodes of at least one of the plurality of series arm acoustic wave resonators are covered by a thinner layer of $SiO_2$ than the IDT electrodes of the plurality of parallel arm acoustic wave resonators.

10. The filter of claim 1 wherein the IDT electrodes of at least one of the plurality of parallel arm acoustic wave resonators are covered by a thinner layer of $SiO_2$ than the IDT electrodes of the plurality of series arm acoustic wave resonators.

11. The filter of claim 1 further comprising a layer of a silicon nitride covering the $SiO_2$ over each of the IDT electrodes of the plurality of series arm acoustic wave resonators, the IDT electrodes of the plurality of parallel arm acoustic wave resonators, and the IDT electrodes of the at least one additional acoustic wave resonator.

12. The filter of claim 1 wherein the IDT electrodes of the plurality of series arm acoustic wave resonators and the IDT electrodes of the plurality of parallel arm acoustic wave resonators have a greater pitch than the IDT electrodes of the at least one additional acoustic wave resonator.

13. The filter of claim 1 wherein the filter is a radio frequency filter.

14. The filter of claim 1 included in a fifth-generation radio frequency circuit.

15. The filter of claim 1 included in an electronic device module.

16. The filter of claim 15 included in a transmit and receive module.

17. The filter of claim 15 wherein the electronic device module is a radio frequency device module.

18. The filter of claim 17 included in an electronic device.

19. A method of forming an electronic filter, the method comprising:
    forming a plurality of series arm acoustic wave resonators electrically connected in series between an input port and an output port;
    forming a plurality of parallel arm acoustic wave resonators electrically connected in parallel and electrically connected on first sides between respective ones of the plurality of series arm acoustic wave resonators and electrically connected on second sides to ground; and
    forming at least one additional acoustic wave resonator with a resonant frequency below a lower edge of a passband of the filter, the at least one additional acoustic wave resonator being electrically connected in parallel to one of one of the plurality of series arm acoustic wave resonators and having a temperature coefficient of frequency (TCF) lower than a TCF of the acoustic wave resonator to which it is electrically connected in parallel.

20. The method of claim 19 wherein the plurality of series arm acoustic wave resonators, the plurality of parallel arm acoustic wave resonators, and the at least one additional acoustic wave resonator are bulk acoustic wave (BAW) resonators.

21. The method of claim 19 wherein forming the at least one additional acoustic wave resonator further includes electrically connecting at least one additional acoustic wave resonator with a resonant frequency above an upper edge of a passband of the filter in parallel to one of the plurality of parallel arm acoustic wave resonators.

22. The method of claim 19 wherein the plurality of series arm acoustic wave resonators, the plurality of parallel arm acoustic wave resonators, and the at least one additional acoustic wave resonator are surface acoustic wave (SAW) resonators having interdigital transducer (IDT) electrodes disposed on a piezoelectric substrate and the method further comprises depositing a film of silicon dioxide on the IDT electrodes of each of the plurality of series arm acoustic wave resonators, the plurality of parallel arm acoustic wave resonators, and the at least one additional acoustic wave resonator.

23. The method of claim 22 wherein forming the film of silicon dioxide on the IDT electrodes of the at least one additional acoustic wave resonator comprises forming a thicker film of silicon dioxide on the IDT electrodes of the at least one additional acoustic wave resonator than the films of silicon dioxide on the plurality of series arm acoustic wave resonators and the plurality of parallel arm acoustic wave resonators.

24. The method of claim 23 further comprising forming films of silicon dioxide on the plurality of series arm acoustic wave resonators that are thinner than films of silicon dioxide formed on the plurality of parallel arm acoustic wave resonators.

25. An electronic filter comprising:
    a plurality of series arm acoustic wave resonators electrically connected in series between an input port and an output port;
    a plurality of parallel arm acoustic wave resonators electrically connected in parallel and electrically connected on first sides between respective ones of the plurality of series arm acoustic wave resonators and electrically connected on second sides to ground; and
    at least one additional acoustic wave resonator electrically connected in parallel to one of the plurality of series arm acoustic wave resonators and having a temperature coefficient of frequency (TCF) lower than a TCF of the acoustic wave resonator to which it is electrically connected in parallel, the plurality of series arm acoustic wave resonators, the plurality of parallel arm acoustic wave resonators, and the at least one additional acoustic wave resonator being surface acoustic wave (SAW) resonators having interdigital transducer (IDT) electrodes disposed on a piezoelectric substrate, the IDT electrodes of the plurality of series arm acoustic wave resonators, the plurality of parallel arm acoustic wave resonators, and the at least one additional acoustic wave resonator being covered by silicon dioxide ($SiO_2$), the IDT electrodes of the at least one additional acoustic wave resonator being covered by a thicker layer of $SiO_2$ than the IDT electrodes of the plurality of series arm acoustic wave resonators and the IDT electrodes of the plurality of parallel arm acoustic wave resonators, the IDT electrodes of at least one of the plurality of series arm acoustic wave resonators being covered by a thinner layer of $SiO_2$ than the IDT electrodes of the plurality of parallel arm acoustic wave resonators.

* * * * *

UNITED STATES PATENT AND TRADEMARK OFFICE
CERTIFICATE OF CORRECTION

PATENT NO. : 10,979,028 B2
APPLICATION NO. : 16/392826
DATED : April 13, 2021
INVENTOR(S) : Tomoya Komatsu et al.

It is certified that error appears in the above-identified patent and that said Letters Patent is hereby corrected as shown below:

In the Specification

Column 5, Line 21, delete "ID" and insert -- 1D --.
Column 8, Line 59, delete "ID" and insert -- 1D --.
Column 8, Line 67, delete "ID" and insert -- 1D --.

Signed and Sealed this
Eighteenth Day of May, 2021

Drew Hirshfeld
*Performing the Functions and Duties of the*
*Under Secretary of Commerce for Intellectual Property and*
*Director of the United States Patent and Trademark Office*